United States Patent
Morishita

(10) Patent No.: US 10,424,920 B2
(45) Date of Patent: Sep. 24, 2019

(54) SEMICONDUCTOR DEVICE

(71) Applicant: Renesas Electronics Corporation, Tokyo (JP)

(72) Inventor: Yasuyuki Morishita, Kodaira (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 260 days.

(21) Appl. No.: 15/469,450

(22) Filed: Mar. 24, 2017

(65) Prior Publication Data

US 2017/0331284 A1 Nov. 16, 2017

(30) Foreign Application Priority Data

May 10, 2016 (JP) .................... 2016-094296

(51) Int. Cl.
*H02H 9/04* (2006.01)
*H01L 27/02* (2006.01)

(52) U.S. Cl.
CPC ......... *H02H 9/044* (2013.01); *H01L 27/0266* (2013.01)

(58) Field of Classification Search
CPC ............................ H02H 9/044; H01L 27/0266
USPC .......................................................... 361/56
See application file for complete search history.

(56) References Cited

U.S. PATENT DOCUMENTS

| 2007/0085144 A1* | 4/2007 | Chen | H01L 27/0251 257/362 |
| 2011/0310515 A1* | 12/2011 | Hayashi | H02H 1/0038 361/56 |
| 2016/0225758 A1* | 8/2016 | Lai | H01L 27/0251 |

FOREIGN PATENT DOCUMENTS

JP 2010-080472 A 4/2010

* cited by examiner

*Primary Examiner* — Kevin J Comber
(74) *Attorney, Agent, or Firm* — McGinn, I.P. Law Group, PLLC

(57) ABSTRACT

A semiconductor device that can have both noise resistance and ESD resistance is provided.
The semiconductor device includes a first and a second digital circuits, a first and a second ground potential lines respectively provided corresponding to the first and the second digital circuits, a first and a second analog circuits, a third and a fourth ground potential lines respectively provided corresponding to the first and the second analog circuits, a first bidirectional diode group provided between the first and the second ground potential lines, a second bidirectional diode group provided between the third and the fourth ground potential lines, and a third bidirectional diode group provided between the first and the third ground potential lines. The number of stages of bidirectional diodes of the third bidirectional diode group is greater than that included in each of the first and the second bidirectional diode groups.

5 Claims, 3 Drawing Sheets

SEMICONDUCTOR DEVICE

CROSS-REFERENCE TO RELATED APPLICATIONS

The disclosure of Japanese Patent Application No. 2016-094296 filed on May 10, 2016 including the specification, drawings and abstract is incorporated herein by reference in its entirety.

BACKGROUND

The present disclosure relates to a semiconductor device, in particular to ESD (Electro Static Discharge) protection.

In a semiconductor device, an electrostatic protection element is provided to prevent internal circuits from being broken by static electricity. For example, an electrostatic protection element formed by a diode, a thyristor (SCR: Silicon Controlled Rectifier), or the like is coupled between a wiring to which a power supply potential is supplied (a power supply potential line) and a wiring to which a ground potential is supplied (a ground potential line). When static electricity is applied between the power supply potential line and the ground potential line, the static electricity is discharged through the electrostatic protection element and no excessive voltage is applied to the internal circuits, so that it is possible to prevent the internal circuits from being broken.

Further, in a semiconductor device in which a power supply system is separated, the ground potential line is also divided into a plurality of systems, and a predetermined number of diodes may be coupled in inverse parallel between the divided ground potential lines.

In this respect, Japanese Unexamined Patent Application Publication No. 2010-80472 discloses a configuration in which a bidirectional diode is provided between the divided ground potential lines to secure a discharge path.

SUMMARY

On the other hand, regarding noise propagation, only potential barriers, the number of which corresponds to the number of stages of diodes, are secured, so that it is preferable to provide a plurality of stages of diodes in order to improve noise resistance.

However, when a plurality of stages of diodes are uniformly arranged, the impedance of discharge path increases, so that voltage breakdown of internal circuits easily occurs. Therefore, ESD protection measures for the internal circuits are required. In this respect, there is a large number of nodes of the internal circuits where the ESD protection measures are required, so that much time is required for chip design verification. Further, the chip area may become large.

The present disclosure is made to solve the problems described above, and an object of the present disclosure is to provide a semiconductor device that can have both noise resistance and ESD resistance.

Other objects and novel features will become apparent from the description of the present specification and the accompanying drawings.

According to an embodiment, a semiconductor device includes a first and a second digital circuits, a first and a second ground potential lines respectively provided corresponding to the first and the second digital circuits, a first and a second analog circuits, a third and a fourth ground potential lines respectively provided corresponding to the first and the second analog circuits, a first bidirectional diode group provided between the first ground potential line and the second ground potential line, a second bidirectional diode group provided between the third ground potential line and the fourth ground potential line, and a third bidirectional diode group provided between the first ground potential line and the third ground potential line. The number of stages of bidirectional diodes of the third bidirectional diode group is greater than the number of stages of bidirectional diodes included in each of the first and the second bidirectional diode groups.

According to the embodiment, it is possible to achieve both the noise resistance and the ESD resistance.

DETAILED DESCRIPTION

Figure 1:
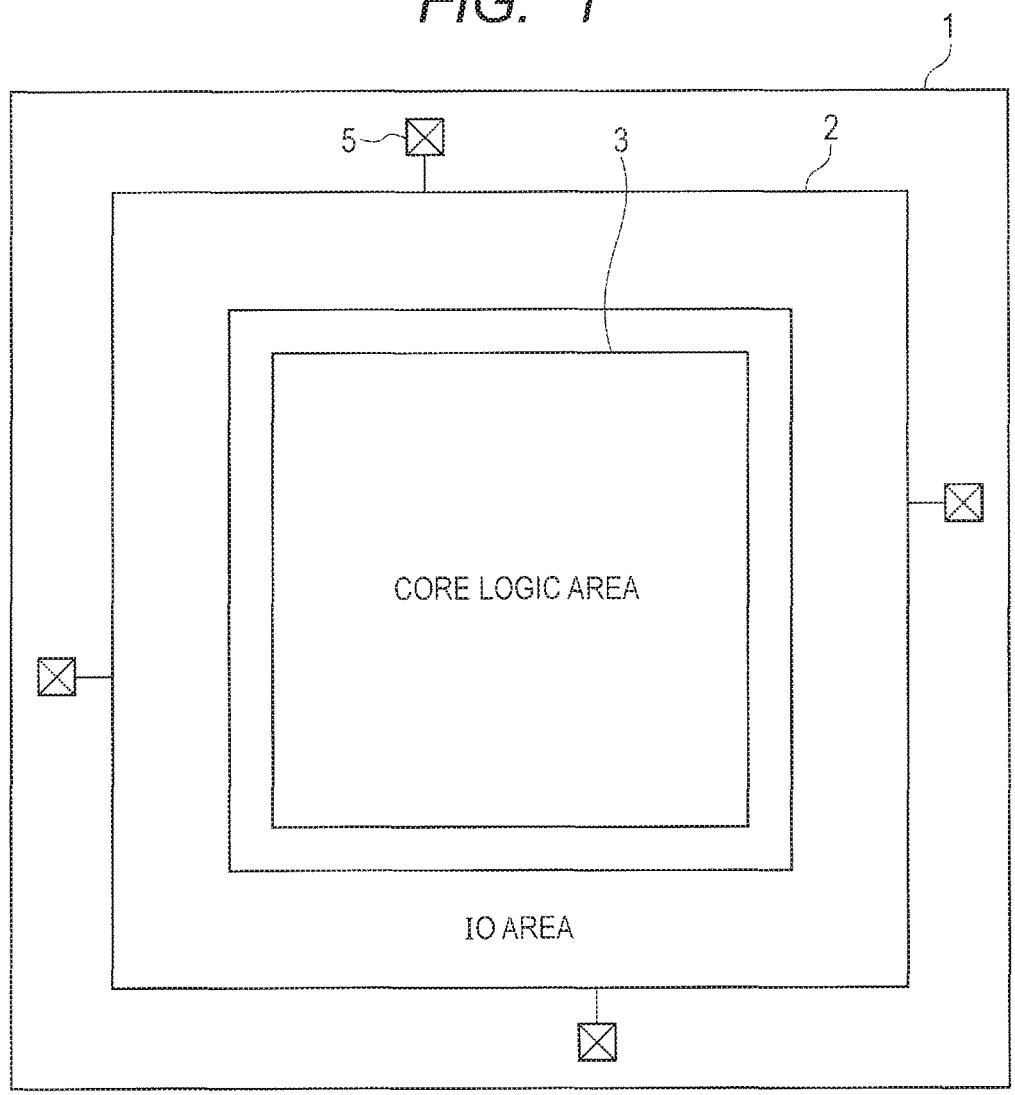
FIG. 1 is a diagram for explaining an entire semiconductor device 1 based on an embodiment.

An embodiment will be described in detail with reference to the drawings. The same reference numerals are given to the same or corresponding portions in the drawings and the description thereof will not be repeated. In the embodiment, a semiconductor device represents any of a semiconductor wafer formed so that electronic circuits are integrated, each of semiconductor chips which are formed by dividing the semiconductor wafer into individual pieces, and a device where a single or a plurality of semiconductor chips are packaged by resin or the like.

FIG. 1 is a diagram for explaining an entire semiconductor device 1 based on the embodiment.

As shown in FIG. 1, the semiconductor device 1 includes an input/output circuit (IO) area 2 provided in an outer circumferential area, a core logic area 3 that which is arranged in an inner area and is formed as ASIC (application specific integrated circuit) having a predetermined function, and a pad 5 provided outside the IO area 2.

In the IO area 2, a circuit to be an input/output interface of a signal is provided. In the present example, an analog IO circuit and a digital IO circuit are respectively provided.

Also in the core logic area 3, an analog system and a digital system are respectively provided. In the present example, an analog core circuit and a digital core circuit are respectively provided.

Figure 2:
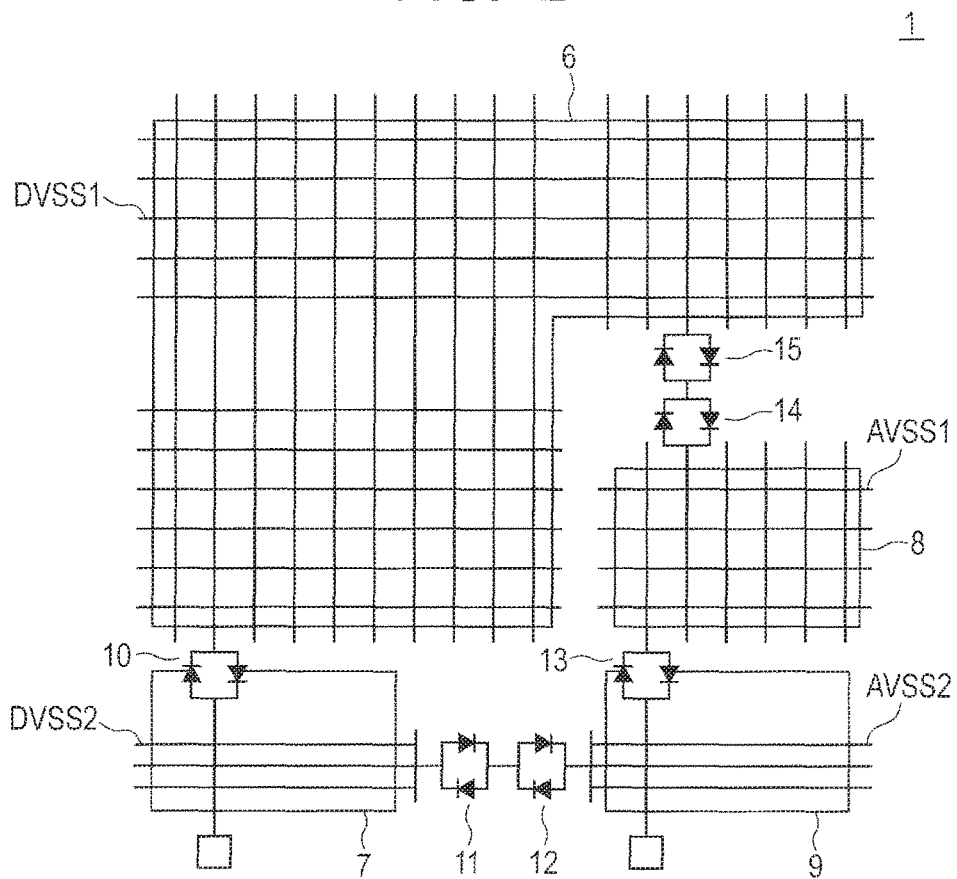
FIG. 2 is a diagram for explaining a configuration of ground potential lines of the semiconductor device 1 based on the embodiment.

FIG. 2 is a diagram for explaining a configuration of ground potential lines of the semiconductor device 1 based on the embodiment.

As shown in FIG. 2, the ground potential lines are independently provided in each area.

In the present example, regarding the core logic area 3, a digital core circuit area 6 where the digital core circuit is provided and an analog core circuit area 8 where the analog core circuit is provided are shown.

Further, regarding the IO area 2, a digital IO circuit area 7 where the digital IO circuit is provided and an analog IO circuit area 9 where the analog IO circuit is provided are shown.

A case is shown in which the digital core circuit area 6 is provided with a plurality of ground potential lines DVSS1 for supplying a ground voltage to the digital core circuit.

A case is shown in which the analog core circuit area 8 is provided with a plurality of ground potential lines AVSS1 for supplying the ground voltage to the analog core circuit.

A case is shown in which the digital IO circuit area 7 is provided with a plurality of ground potential lines DVSS2 for supplying a ground voltage to the digital IO circuit.

A case is shown in which the analog IO circuit area 9 is provided with a plurality of ground potential lines AVSS2 for supplying the ground voltage to the analog IO core circuit.

A bidirectional diode element or bidirectional diode elements are provided between a set of ground potential lines and a set of ground potential lines, which are separated from each other.

In the present example, one stage of bidirectional diode element 10 is provided between the ground potential lines DVSS1 and the ground potential lines DVSS2, both of which are digital system.

Further, one stage of bidirectional diode element 13 is provided between the ground potential lines AVSS1 and the ground potential lines AVSS2, both of which are analog system.

On the other hand, when a digital system and an analog system are coupled, two stages of bidirectional diode elements are provided. For example, two stages of bidirectional diode elements 14 and 15 are provided between the ground potential lines AVSS1 and the ground potential lines DVSS1. Further, two stages of bidirectional diode elements 11 and 12 are provided between the ground potential lines AVSS2 and the ground potential lines DVSS2.

Figure 3:
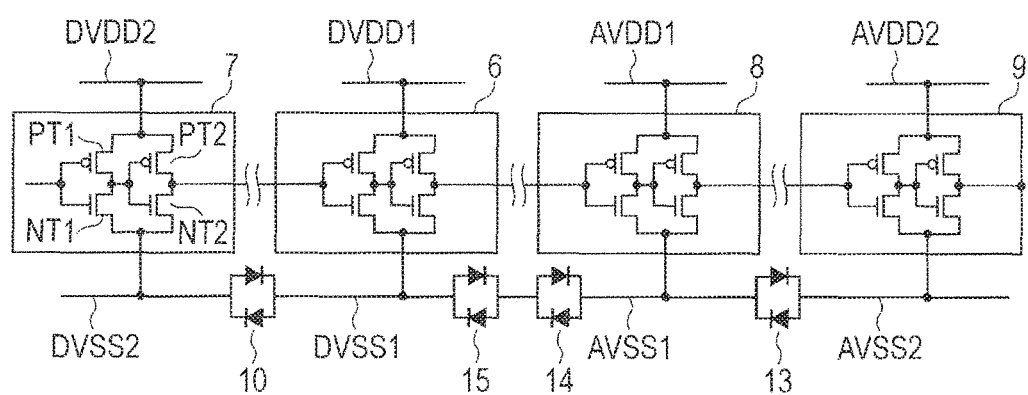
FIG. 3 is a diagram showing a concept of a configuration of each circuit area based on the embodiment.

FIG. 3 is a diagram showing a concept of a configuration of each circuit area based on the embodiment.

As shown in FIG. 3, the digital IO circuit area 7 is provided with, as an example, two stages of inverters that receive an input signal and operate.

As an example, P-channel MOS transistors PT1 and PT2 and N-channel MOS transistors NT1 and NT2 are provided.

The P-channel MOS transistor PT1 and the N-channel MOS transistor NT1 are provided between a power supply potential line DVDD2 and the ground potential line DVSS2 and receive an input of the input signal. The P-channel MOS transistor PT2 and the N-channel MOS transistor NT2 are provided between the power supply potential line DVDD2 and the ground potential line DVSS2 and receive an input of a coupling node of the P-channel MOS transistor PT1 and the N-channel MOS transistor NT1.

A case is shown in which the other circuit areas are provided with the same inverters.

In the present example, a discharge path is required to be provided between the ground potential lines independent from each other, so that a bidirectional diode element is provided. For example, a bidirectional diode element 10 is provided between the ground potential line DVSS1 and the ground potential line DVSS2.

On the other hand, when a digital circuit that tends to generate noise is provided close to an analog circuit that tends to be affected by noise, if the same number of stages of bidirectional diode elements is provided, the noise resistance may be insufficient.

Therefore, in the present example, two stages of bidirectional diode elements 14 and 15 are provided between the ground potential line DVSS1 provided in the digital core circuit area 6 and the ground potential line AVSS1 provided in the analog core circuit area 8.

In other words, the number of stages of bidirectional diode elements provided between a digital system circuit and an analog system circuit is greater than the number of stages of bidirectional diode elements provided between a digital system circuit and a digital system circuit or between an analog system circuit and an analog system circuit. Although not shown in FIG. 3, two stages of bidirectional diode elements 11 and 12 are provided between the ground potential line DVSS2 provided in the digital IO circuit area 7 and the ground potential line AVSS2 provided in the analog IO circuit area 9.

By the configuration described above, it is possible to secure ESD resistance while increasing noise resistance between the digital system circuit and the analog system circuit.

Further, a plurality of stages of bidirectional diode elements are provided between the digital system circuit and the analog system circuit, so that it is possible to easily know a portion where impedance increases in the discharge path and easily perform chip design verification. It is also possible to suppress increase of the area of the chip.

Further, it is possible to improve ESD resistance for a CDM (Charged Device Model) test.

Modified Example 1

Figure 4:
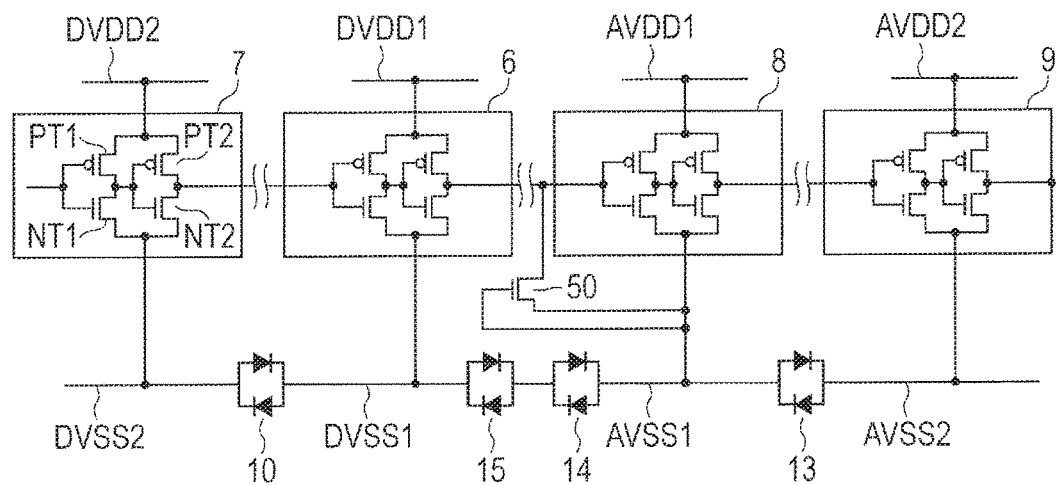
FIG. 4 is a diagram showing a concept of a configuration of each circuit area according to a modified example 1 of the embodiment.

FIG. 4 is a diagram showing a concept of a configuration of each circuit area according to a modified example 1 of the embodiment.

As shown in FIG. 4, the configuration is different from the configuration of FIG. 3 in a point that a clamp circuit is provided.

Specifically, the difference is that an N-channel MOS transistor 50 for preventing ESD damage is provided to an input gate of an inverter as a clamp circuit.

The N-channel MOS transistor 50 is provided between the input gate and the ground potential line AVSS1, and the gate of the N-channel MOS transistor 50 is coupled to the ground potential line AVSS1.

By this configuration, a clamp circuit is provided to a portion where the impedance of discharge path increases and voltage breakdown may occur. Therefore, it is possible to further improve the ESD resistance.

Modified Example 2

Figure 5:
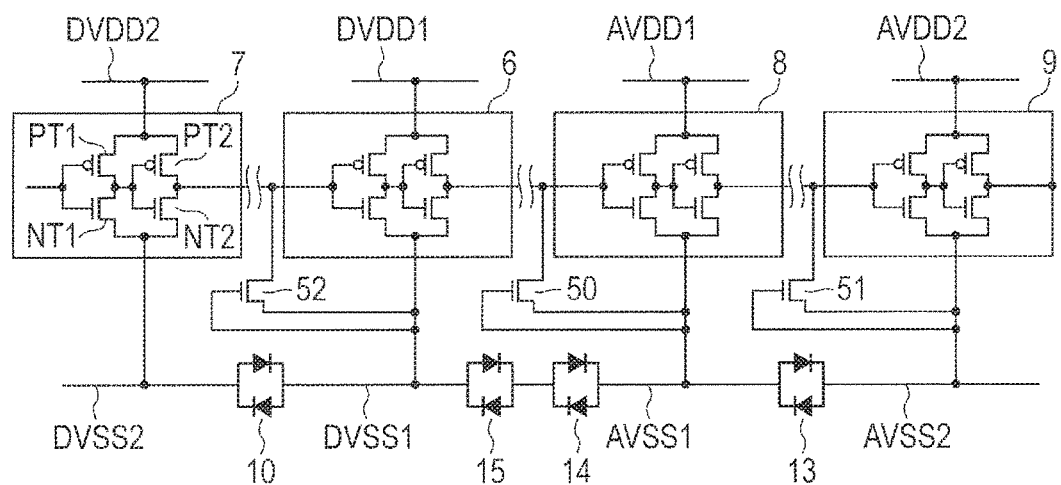
FIG. 5 is a diagram showing a concept of a configuration of each circuit area according to a modified example 2 of the embodiment.

FIG. 5 is a diagram showing a concept of a configuration of each circuit area according to a modified example 2 of the embodiment.

As shown in FIG. 5, the configuration is different from the configuration of FIG. 3 in a point that a plurality of clamp circuits are provided.

Specifically, the difference is that N-channel MOS transistors 50, 51, and 52 for preventing ESD damage are provided to input gates of inverters, where voltage breakdown may occur, as clamp circuits.

The N-channel MOS transistor 51 is provided between an input gate and the ground potential line AVSS2, and the gate of the N-channel MOS transistor 51 is coupled to the ground potential line AVSS2.

The N-channel MOS transistor 52 is provided between an input gate and the ground potential line DVSS1, and the gate of the N-channel MOS transistor 52 is coupled to the ground potential line DVSS1.

The N-channel MOS transistor 50 is provided between an input gate and the ground potential line AVSS1, and the gate of the N-channel MOS transistor 50 is coupled to the ground potential line AVSS1.

In this configuration, a clamp circuit is provided to the input gate of each circuit. Thereby, it is possible to further improve the ESD resistance.

Further, in the present example, the element size of the N-channel MOS transistor 50 can be changed from the element sizes of the other N-channel MOS transistors 51 and 52.

It is possible to further improve the ESD resistance by increasing the element size of the N-channel MOS transistor 50 to greater than the element sizes of the other N-channel MOS transistors 51 and 52.

While the present disclosure has been specifically described based on the embodiment, it is needless to say that the disclosure is not limited to the embodiment and may be variously modified without departing from the scope of the disclosure.

What is claimed is:

1. A semiconductor device comprising:
   a first and a second digital circuits;
   a first and a second ground potential lines respectively provided corresponding to the first and the second digital circuits;
   a first and a second analog circuits;
   a third and a fourth ground potential lines respectively provided corresponding to the first and the second analog circuits;
   a first bidirectional diode group provided between the first ground potential line and the second ground potential line;
   a second bidirectional diode group provided between the third ground potential line and the fourth ground potential line; and
   a third bidirectional diode group provided between the first ground potential line and the third ground potential line,
   wherein a number of stages of bidirectional diodes of the third bidirectional diode group is greater than a number of stages of bidirectional diodes included in each of the first and the second bidirectional diode groups,
   wherein the first analog circuit further includes a first transistor element including an input gate, and a first clamp element provided between the input gate and the third ground potential line,
   wherein the second analog circuit further includes a second transistor element including an input gate, and a second clamp element provided between the input gate and the fourth ground potential line, and
   wherein a size of the first clamp element is greater than that of the second clamp element.

2. The semiconductor device according to claim 1, wherein the first and the second bidirectional diode groups are formed by one stage and the third bidirectional diode group is formed by two or more stages.

3. The semiconductor device according to claim 1, wherein the first bidirectional diode group is provided between a digital core area where the first digital circuit is provided and a digital input/output area where the second digital circuit is provided,
   wherein the second bidirectional diode group is provided between an analog core area where the first analog circuit is provided and an analog input/output area where the second digital circuit is provided, and
   wherein the third bidirectional diode group is provided between the digital core area and the analog core area.

4. The semiconductor device according to claim 3, further comprising:
   a fourth bidirectional diode group which is provided between the second ground potential line and the fourth ground potential line and which has stages of bidirectional diodes, the number of which is greater than the number of stages of bidirectional diodes included in each of the first and the second bidirectional diode groups,
   wherein the fourth bidirectional diode group is provided between the digital input/output area and the analog input/output area.

5. The semiconductor device according to claim 1, wherein the first clamp element is coupled between the input gate and the third ground potential line, and a gate of the first clamp element is formed by an N-channel MOS transistor coupled with the third ground potential line.

* * * * *